United States Patent [19]
Ahn et al.

[11] Patent Number: 5,567,645
[45] Date of Patent: Oct. 22, 1996

[54] DEVICE ISOLATION METHOD IN INTEGRATED CIRCUITS

[75] Inventors: Sung-tae Ahn, Kwacheon; Tai-su Park, Seoul, both of Rep. of Korea

[73] Assignee: Samsung Electronics Co., Ltd., Suwon, Rep. of Korea

[21] Appl. No.: 231,705

[22] Filed: Apr. 22, 1994

[30] Foreign Application Priority Data

Apr. 24, 1993 [KR] Rep. of Korea ............... 93-6925

[51] Int. Cl.⁶ ............................................. H01L 21/76
[52] U.S. Cl. ........................ 437/69; 437/70; 437/984; 437/72
[58] Field of Search ..................... 437/69, 72, 984, 437/70; 198/DIG. 85, DIG. 86, DIG. 117

[56] References Cited

U.S. PATENT DOCUMENTS

| | | | |
|---|---|---|---|
| 3,900,350 | 8/1975 | Appels et al. | 437/72 |
| 3,911,562 | 10/1975 | Youmans | 156/636 |
| 4,721,687 | 1/1988 | Kakumu et al. | 437/69 |

FOREIGN PATENT DOCUMENTS

| | | | |
|---|---|---|---|
| 60-128635 | 7/1985 | Japan | 437/69 |
| 61-6840 | 1/1986 | Japan | 437/69 |
| 3266435 | 11/1991 | Japan | 437/69 |
| 4177724 | 6/1992 | Japan | 437/69 |
| 4162528 | 6/1992 | Japan | 437/69 |

OTHER PUBLICATIONS

Wolf, S. et al, Silicon Processing for the VLSI Era: Process Technology, Lattice Press, 1986, pp. 556–557.
Wolf, S., *Silicon Processing for the VLSI Era: vol. 1, Process Technology*, Lattice Press, pp. 182–187, ©1986.

*Primary Examiner*—George Fourson
*Attorney, Agent, or Firm*—Cushman Darby & Cushman, L.L.P.

[57] ABSTRACT

An improved method for performing a local oxidation of silicon (LOCOS) capable of forming a sufficient thickness of a field oxide film even in narrow isolation regions. After defining the isolation region, a first field oxide film is formed in the isolation region by means of a first field oxidation. A film formed of HTO, LTO or SOG, or a pre-oxide film formed of polysilicon is formed on the resultant product. Then, the film, oxide film or the pre-oxide film is removed by anisotropically etching with a dry etching process or a chemical mechanical process so as to be left only in the isolation region, which after a second field oxidation forms a second field oxide film. According to the present invention, the problems associated with the field oxide film thinning effect usually associated with the conventional LOCOS-series isolation method can be overcome by either making the isolation structure in narrow isolation regions have a total thickness which is equal to that in the wide isolation regions, or by making the former thicker than the latter.

14 Claims, 2 Drawing Sheets

DEVICE ISOLATION METHOD IN INTEGRATED CIRCUITS

FIELD OF THE INVENTION

The present invention relates to a method of device isolation in integrated circuits. More particularly, it relates to an improved method for performing a local oxidation of silicon capable of forming a sufficient thickness of a field oxide film in an isolation (inactive) region even in places having a narrow width.

BACKGROUND OF THE RELATED ART

Before integrated circuits were highly integrated, isolation was sufficiently obtained by junction isolation technology in bipolar devices, while a more perfect isolation was obtained between adjacent oxide films in metal oxide silicon (MOS) devices by a protection oxide film. However, the more recent trend of semiconductor devices toward higher integration creates the need for a minimization of isolation regions.

Until now, the local oxidation of silicon (LOCOS) method has been chiefly utilized for device isolation. However, in creating isolation regions with design dimensions now being in units of sub-microns, the LOCOS method has several problems. One problem is a field oxide film thinning effect caused at the time of forming the structure of the isolation regions. It is known that the field oxide thinning effect is due to the fact that field oxide film grows much more in wide isolation regions than in narrow isolation regions (see, for example, "Silicon Processing for the VLSI ERA" Vol 2 California, Lattice Press, 1990, p. 26 by S. Wolf).

FIG. 1 is a cross-sectional view for explaining the field oxide film thinning effect appearing in the conventional LOCOS-series isolation method. Field oxide films 3 and 4 are formed respectively in narrow and wide isolation regions 5 and 6, which are defined by partly etching a nitride film 2 on a semiconductor substrate 1. The narrow isolation region 5 has a width of $W_1$ while the wide isolation region 6 has a width of $W_2$. The field oxide film 3 in the narrow isolation region 5 has a thickness of $L_1$, while the field oxide film 4 in the wide isolation region 6 has a thickness of $L_2$. As is conventionally known, if the width $W_1$ of the narrow isolation region 5 is smaller than the width $W_2$ of the wide isolation region 6, the thickness $L_1$ of the field oxide film 3 in the narrow isolation region 5 becomes thinner than the thickness $L_2$ of the field oxide film 4 in the wide isolation region 6. Accordingly, the smaller the width of the isolation region, the smaller the formed thickness of the field oxide film. Therefore, a difference in the thickness of the field oxide film is generated in isolation regions of different width. This difference in thickness becomes very severe when the width of the isolation region is sub-micron sized. For example, in the conventional method of the above reference, the field oxide film in a wide (1.5 µm) isolation region grows to about the thickness of 400 nm, while the field oxide film in a narrow (0.8 µm) isolation region grows only to the thickness of about 290 nm.

It is known that the field oxide film thinning effect is caused by the difference in the amount of oxidants available in the wide isolation region 6 compared with those available in the narrow isolation region 5.

The field oxide film thinning effect causes various problems. Before the formation of a gate electrode, a wet etching removes the same amount of field oxide film from the wide isolation region 6 as is removed from the narrow isolation region 5. Accordingly, an insufficient amount of the field oxide film remains in the narrow isolation region 5. Furthermore, because of the field oxide film 3 in the narrow isolation region 5 is thinner, source/drain ions are injected more closely to the underlying layers, generating a problem of punchthrough. Moreover, a stringer problem is caused by the field oxide film which is left below the sharp step of the field oxide resulting from an etch-back process, which causes a post gate poly-silicon etch to be insufficient, thereby leaving unetched field oxide film remnants connected to each other. Furthermore, since the thickness $L_1$ of the field oxide film 3 in the narrow isolation region 5 becomes thin, the capacitance between the gate polysilicon and the underlying silicon is increased, which decreases the speed of the semiconductor device. There is also the problem that the resulting positions of ions implanted during a field ion implantation cannot be made identical to each other in the field oxide film between isolation regions of differing widths, and it is also difficult to adjust a threshold voltage of the device.

SUMMARY OF THE INVENTION

To solve the various problems in the conventional isolation method described above due to the field oxide film thinning effect, it is an object of the present invention to provide an improved LOCOS method capable of forming an isolation structure in which a thickness of a field oxide film at a narrow isolation region is made equal to that at a wide isolation region, or the former is made thicker than the latter.

To accomplish the above object, there is provided an device isolation method in integrated circuits according to the present invention comprising the steps of: forming sequentially a pad oxide film and a nitride film on a semiconductor substrate; defining an isolation region for electrically isolating an active region by partly etching the nitride film; forming a first field oxide film by thermal oxidation of the isolation region; forming an oxide film by covering the etched nitride film and the first field oxide film with an oxide material; forming a second field oxide film on the first field oxide film by removing the oxide film so that the oxide film remains self-aligned only in the isolation region; and removing the nitride film and the pad oxide film in the active region.

The above object according to the present invention is also accomplished by providing a device isolation method in integrated circuits comprising the steps of: forming sequentially a pad oxide film and a nitride film on a semiconductor substrate; defining an isolation region for electrically isolating an active region by partly etching the nitride film; forming a first field oxide film by thermal oxidation of the isolation region; forming a pre-oxide film by covering the etched nitride film and the first field oxide film with a pre-oxide material; removing the pre-oxide film so that the pre-oxide film remains self-aligned only in the isolation region; forming a second field oxide film by field oxidizing the pre-oxide film remaining on the first field oxide film; and sequentially removing the nitride film and the pad oxide film in the active region.

According to the present invention, punchthrough and stringer problems due to the field oxide film thinning effect are prevented. Consequently, the conventional problems of a reduction in speed and the difficulty in adjusting a threshold voltage of a semiconductor device due to an increase of it's capacitance can be solved.

BRIEF DESCRIPTION OF THE DRAWINGS

Further features and advantages of the present invention will become more apparent from the following description and with reference being made to the accompanying drawings wherein preferred embodiments of present invention are clearly shown, in which.

DESCRIPTION OF PREFERRED EMBODIMENTS

Preferable embodiments of the present invention will be described hereinbelow with reference to the accompanying drawings.

Figure 1:
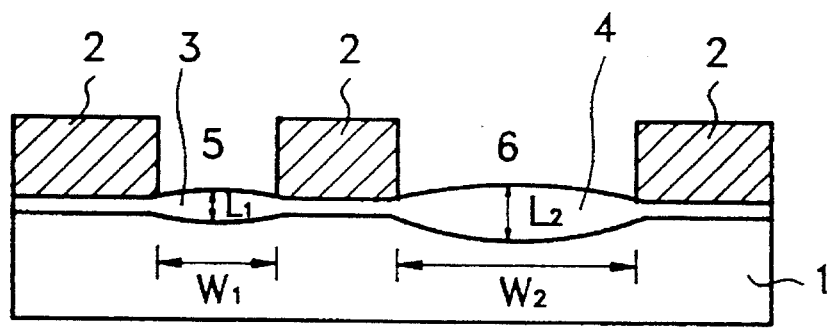
FIG. 1 is a cross-sectional view for explaining the field oxide film thinning effect which occurs in the conventional LOCOS isolation method.
Figure 2A:
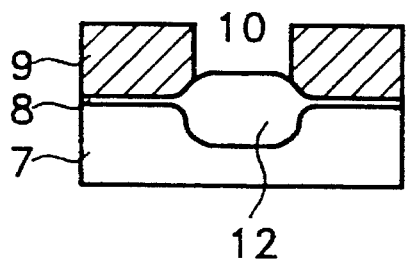
FIGS. 2A and 2B, FIGS. 3A and 3B, and FIGS. 4A and 4B represent an isolation method of a semiconductor device according to a first embodiment of the present invention.
Figure 2B:
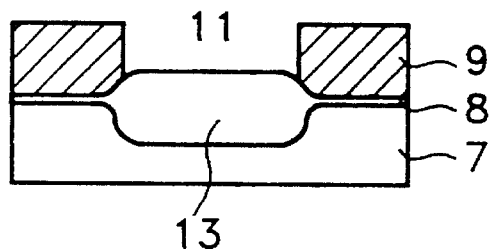
Figure 3A:
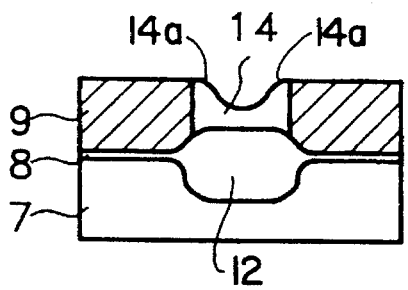
Figure 3B:
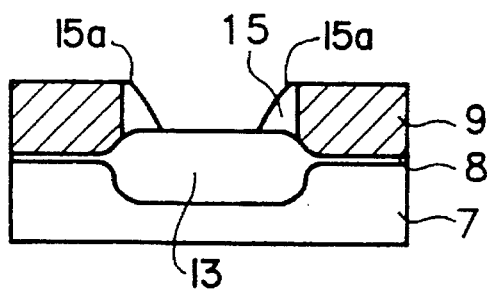
Figure 4A:
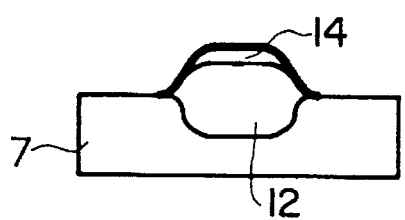
Figure 4B:
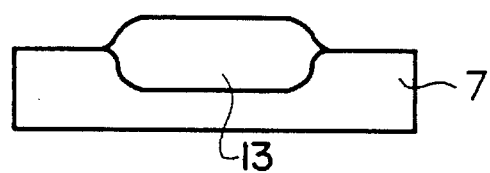

FIGS. 2A, 3A and 4A represent an isolation method of the present invention in a narrow isolation region, while FIGS. 2B, 3B and 4B represent an isolation method of the present invention in a wide isolation region.

Referring to FIGS. 2A and 2B, a pad oxide film 8 is thermally grown on a semiconductor substrate 7 in the same manner as in the conventional method. A nitride film 9 is vapor deposited thereon in a thickness of about 1,000 to 2,000 A. Thereafter, a portion of the nitride film 9 is etched by a photolithography process to expose an isolation region. Accordingly, a narrow 10 or a wide isolation region 11 for electrically isolating an active region are defined, as shown in FIGS. 2A and 2B, respectively.

If the risk of punchthrough is high between the active regions due to the small depth of the recess, a recessed structure may be formed by sequentially etching the pad oxide film 8 and the semiconductor substrate 7 in the exposed isolation regions 10, 11 by partially etching the nitride film 9 by a dry or wet etching method.

Thereafter, the nitride film 9 is used as an oxidation mask to grow a first field oxide film 12, 13 in the isolation regions 10, 11 to a thickness of about 1,000 to 2,000 A by a thermal oxidation of the isolation regions 10, 11. As explained above with reference to the conventional method, the field oxide layer 12 in the narrow isolation region 10 will not grow as thick as will the field oxide layer 13 in the wide isolation region 11.

The whole surface of the resultant product is then covered with a material such as high temperature oxide (HTO), low temperature oxide (LTO) or spin on glass (SOG), etc., to form a film (not shown) by vapor deposition. The film is then removed by an anisotropic etching operation performed by a dry etching or a chemical mechanical polishing (CMP) method so that self-aligned film remains only in the isolation regions 10, 11. Accordingly, this forms a second film 14, 15 on the first field oxide film 12, 13.

As shown in FIGS. 3A and 3B, some of the film remains over the whole narrow isolation region 10 as if the contact etch were not completed to form the second film 14, while the film remaining in the wide isolation region 11 is left in the pattern of a spacer and forms the second film 15. If the film is removed not by the anisotropic etching performed by the dry etching method but rather by a CMP method, the amount of the remaining material is the same as before in the wide isolation region 11, while a far greater amount of the material remains in the narrow isolation region 10. Accordingly, the thickness of the second film 14 in the narrow isolation region 10 is increased to thereby heighten the effect of the present invention. By doing so, an isolation structure is obtained in which the total thickness of the first field oxide film 12 and second film 14 in the narrow isolation region 10 is made equal to that of the first field oxide film 13 in the wide isolation region 11. Alternatively, the thickness of the first field oxide film and second film 14 in the narrow isolation region 10 may even be made larger than that of the first field oxide film 13 in the wide isolation region 11.

The second film 14, 15 may be annealed to transform the second film 14, 15 into a structure like a thermal oxide film which is endurable to wet etching. Such an annealing process can be performed immediately after forming the oxide film by covering the oxide material before forming the second film 14, 15.

The nitride film 9 and the pad oxide film 8 in the active device formation region are sequentially removed. After removal of the nitride film 9, the upper edge portions 14a, 15a in the second film 14, 15 which project upwardly like a rabbit's ears are rounded off by passing the device through several wet etchings before the gate electrode is formed by polysilicon vapor deposition. Accordingly, a smooth profile is obtained as shown in FIGS. 4A and 4B.

FIGS. 2A, 5A, 6A and 7A represent an isolation method of a second embodiment of the present invention in the narrow isolation region, while FIGS. 2B, 5B, 6B and 7B represent an isolation method of the second embodiment in the wide isolation region.

A pad oxide film 8 is thermally grown on a semiconductor substrate 7 in the same manner as in the first embodiment described with reference to FIGS. 2A and 2B. A nitride film 9 is vapor deposited thereon to a thickness of about 1,000 to 2,000 A. Thereafter, the nitride film 9 is removed by a photolithography process to define a narrow 10 and a wide isolation region 11 for electrically isolating active regions.

As in the first embodiment, if the risk of punchthrough is high between the active regions due to the small depth of the recess, a recessed structure may be formed.

The nitride film 9 is then used as an oxidation mask to grow a first field oxide film 12, 13 to a thickness of about 1,000 to 2,000 A by thermal oxidation of the isolation regions 10, 11.

Figure 5A:
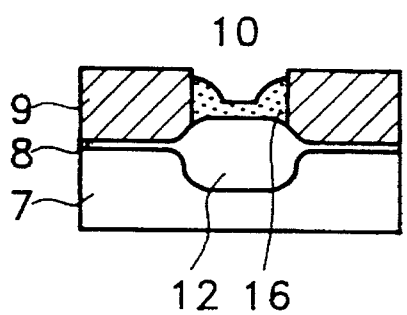
FIGS. 5A and 5B, FIGS. 6A and 6B, and FIGS. 7A and 7B represent together with FIGS. 2A and 2B an isolation method of a semiconductor device according to a second embodiment of the present invention.
Figure 5B:
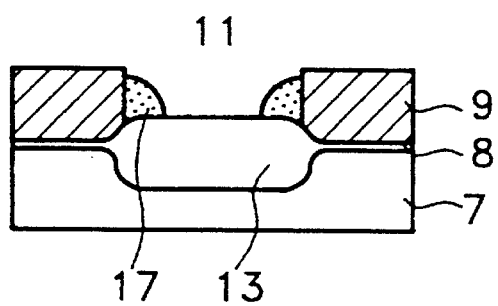

Referring to FIGS. 5A and 5B, a first field oxide film 12, 13 is formed on the narrow 10 and wide isolation regions 11. Thereafter, the whole surface of the resultant product is covered with a pre-oxide material, for example, a polysilicon, to form a pre-oxide film (not shown).

The whole surface of the resultant product is then covered with a pre-oxide material, for example, a polysilicon, to form a pre-oxide film (not shown). The preoxide film is then removed by an anisotropic etching operation performed by a dry etching or a CMP method so that self-aligned pre-oxide film remains only in the isolation regions 10, 11. Accordingly, this leaves pre-oxide film 16 over the entire narrow isolation region 10 as if the contact etch were not completed, and leaves pre-oxide film 17 in the pattern of a spacer in the wide isolation region 11. If the pre-oxide film is removed not by the anisotropic etching performed by the dry etching method but rather by a CMP method, the amount of the remaining pre-oxide material is the same as before in the wide isolation region 11, while a far greater amount of the pre-oxide material remains in the narrow isolation region 10, to thereby heighten the effect of the present invention.

Figure 6A:
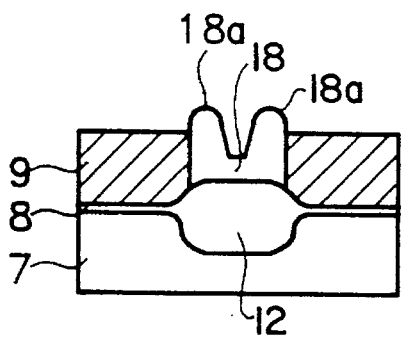
Figure 6B:
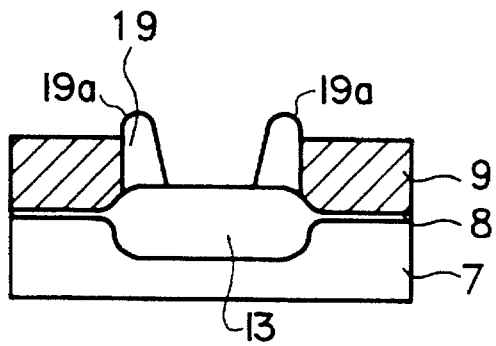

FIGS. 6A and 6B show a second field oxide film 18, 19 formed by secondly field oxidizing the remaining pre-oxide film 16, 17. By doing so, an isolation structure is obtained in which the total thickness of the first and second field oxide films 12, 18 in the narrow isolation region 10 is made equal to that of the first field oxide film 13 in the wide isolation region 11. Alternatively, the total thickness of the first and second field oxide films 12, 18 in the narrow isolation region 10 may be made larger than that of the first field oxide film 13 in the wide isolation region 11.

Figure 7A:
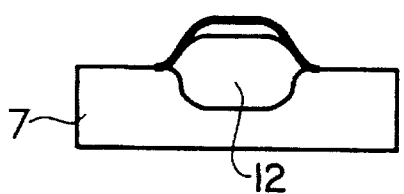
Figure 7B:
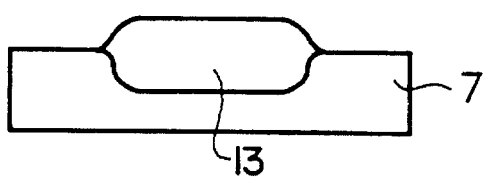

As was performed in the first embodiment, the nitride film 9 and the pad oxide film 8 in the active region are then sequentially removed. After removal of the nitride film, the upper edge portions 18a, 19a of the second field oxide film 18, 19 which project upward like a rabbit's ears are rounded off by passing the resultant structure through several wet etchings, before a subsequent vapor deposition of polysilicon is performed. Accordingly, a smooth profile is obtained as shown in FIGS. 7A and 7B.

As described above, the present invention provides an improved LOCOS method capable of forming an isolation structure in which the total thickness of the field oxide film in narrow isolation regions is equal to that in wide isolation regions, or the former is larger than the latter, to overcome problems associated with the field oxide film thinning effect prevalent with the conventional LOCOS-series isolation method. As a result, the method of the present invention provides a field oxide film having sufficient thickness thereof for isolating devices even in isolation regions having dimensions less than one micron.

Thus, the method of the present invention also prevents punchthrough and stringers due to the field oxide film thinning effect, and reduces the increase in capacitance associated with the conventional method. The reduction in the capacitance increases speed and improves the adjustability of the threshold voltage in the semiconductor device.

The present invention has been described in detail with reference to the preferred embodiments. However, it will be apparent to a person skilled in the art that various modifications in the specific matter of the present invention are possible without departing from the scope of the invention.

What is claimed is:

1. A device isolation method for integrated circuits comprising steps of:

forming sequentially a pad oxide film and a nitride film on a semiconductor substrate;

defining an isolation region for electrically isolating an active region by patterning said nitride film;

forming a first field oxide film by a thermal oxidation of said semiconductor substrate in said isolation region;

depositing a material to cover said patterned nitride film and said first field oxide film, said material being an oxide material or spin on glass;

forming a second film on said first field oxide film by removing a portion of said deposited material which extends farther in a direction normal to a principal surface of said semiconductor substrate than said nitride film so that said deposited material remains self-aligned only on said first field oxide film in said isolation region; and sequentially removing said nitride film and said pad oxide film in said active region.

2. A device isolation method for integrated circuits according to claim 1, further comprising a step of:

forming a recessed structure by sequentially etching said pad oxide film and said semiconductor substrate in said isolation region, immediately after defining said isolation region.

3. A device isolation method for integrated circuits according to claim 1, further comprising a step of annealing said deposited material before said step of forming said second film.

4. A device isolation method for integrated circuits according to claim 2, further comprising a step of annealing said deposited material before said step of forming said second film.

5. A device isolation method for integrated circuits according to claim 1, further comprising a step of annealing said deposited material immediately after forming said second film.

6. A device isolation method for integrated circuits according to claim 2, further comprising a step of annealing said deposited material immediately after forming said second film.

7. A device isolation method for integrated circuits according to claim 1, wherein said deposited material is a high temperature oxide (HTO) material.

8. A device isolation method for integrated circuits according to claim 2, wherein said deposited material is a high temperature oxide (HTO) material.

9. A device isolation method for integrated circuits according to claim 1, wherein said portion of said deposited material is removed in said step of forming said second film by performing an anisotropic etching by a dry etching process.

10. A device isolation method for integrated circuits according to claim 2, wherein said portion of said deposited material is removed in said step of forming said second film by performing an anisotropic etching by a dry etching process.

11. A device isolation method for integrated circuits according to claim 1, wherein said portion of said deposited material is removed in said step of forming said second film by a chemical mechanical polishing.

12. A device isolation method for integrated circuits according to claim 2, wherein said portion of said deposited material is removed in said step of forming said second film by a chemical mechanical polishing.

13. A device isolation method for integrated circuits according to claim 1, wherein said deposited material is a low temperature oxide (LTO) material.

14. A device isolation method for integrated circuits according to claim 2, wherein said deposited material is a low temperature oxide (LTO) material.

* * * * *